(12) United States Patent
Lu

(10) Patent No.: US 12,120,867 B2
(45) Date of Patent: Oct. 15, 2024

(54) MANUFACTURING METHOD OF SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 503 days.

(21) Appl. No.: 17/439,904

(22) PCT Filed: Jun. 22, 2021

(86) PCT No.: PCT/CN2021/101486
§ 371 (c)(1),
(2) Date: Sep. 16, 2021

(87) PCT Pub. No.: WO2022/134503
PCT Pub. Date: Jun. 30, 2022

(65) Prior Publication Data
US 2023/0056584 A1 Feb. 23, 2023

(30) Foreign Application Priority Data

Dec. 23, 2020 (CN) .......................... 202011540296.8

(51) Int. Cl.
*H01L 21/768* (2006.01)
*H01L 21/48* (2006.01)
(Continued)

(52) U.S. Cl.
CPC ..... *H10B 12/482* (2023.02); *H01L 21/76224* (2013.01); *H01L 23/5283* (2013.01)

(58) Field of Classification Search
CPC .. H10B 12/482; H10B 12/033; H10B 12/315; H10B 12/485; H10B 12/34;
(Continued)

(56) References Cited

U.S. PATENT DOCUMENTS

2005/0110078 A1   5/2005   Shino
2019/0103302 A1*  4/2019   Yoon ..................... H10B 12/482
2020/0312707 A1* 10/2020   Chen ..................... H10B 12/30

FOREIGN PATENT DOCUMENTS

CN   106941097 A  *  7/2017
CN   108520876 A  *  9/2018  ............. H10B 12/37
(Continued)

OTHER PUBLICATIONS

International Search Report cited in PCT/CN2021/101486 mailed Aug. 31, 2021, 8 pages.

*Primary Examiner* — Antonio B Crite
*Assistant Examiner* — Tenley H Schofield
(74) *Attorney, Agent, or Firm* — Syncoda LLC; Feng Ma

(57) ABSTRACT

The present application provides a manufacturing method of a semiconductor structure, and relates to the technical field of semiconductors. The manufacturing method includes: providing a substrate; and forming multiple spaced first isolation sidewall structures on the substrate, where first opening regions are formed between adjacent first isolation sidewall structures, and each of the first opening regions is used to expose at least two columns of active regions.

11 Claims, 10 Drawing Sheets

(51) Int. Cl.
*H01L 21/56* (2006.01)
*H01L 21/66* (2006.01)
*H01L 21/68* (2006.01)
*H01L 21/762* (2006.01)
*H01L 23/00* (2006.01)
*H01L 23/31* (2006.01)
*H01L 23/495* (2006.01)
*H01L 23/522* (2006.01)
*H01L 23/528* (2006.01)
*H01L 23/532* (2006.01)
*H10B 12/00* (2023.01)

(58) Field of Classification Search
CPC .. H10B 12/0335; H10B 12/50; H10B 12/053; H01L 21/76224; H01L 23/5283; H01L 22/26
See application file for complete search history.

(56) References Cited

FOREIGN PATENT DOCUMENTS

| | | | | |
|---|---|---|---|---|
| CN | 108831884 | A | 11/2018 | |
| CN | 110534515 | A | 12/2019 | |
| CN | 111710679 | A | 9/2020 | |
| KR | 20080088098 | A | 10/2008 | |
| KR | 101116732 | * | 2/2012 | ........... H10B 12/053 |

* cited by examiner

MANUFACTURING METHOD OF SEMICONDUCTOR STRUCTURE

CROSS-REFERENCE TO RELATED APPLICATION

The present application claims the priority to Chinese Patent Application No. 202011540296.8, titled "MANUFACTURING METHOD OF SEMICONDUCTOR STRUCTURE", filed with China National Intellectual Property Administration (CNIPA) on Dec. 23, 2020, which is incorporated herein by reference in its entirety.

TECHNICAL FIELD

The present application relates to the technical field of semiconductors, in particular to a manufacturing method of a semiconductor structure.

BACKGROUND

The dynamic random access memory (DRAM) is a semiconductor memory that randomly writes and reads data at high speed, and is widely used in data storage devices.

The DRAM is composed of many repeated memory cells. Each memory cell typically includes a capacitor structure and a transistor. In the transistor, the gate is connected to the word line, the drain is connected to the bit line, and the source is connected to the capacitor structure. The voltage signal on the word line controls the transistor to turn on or off, and then the data information stored in the capacitor structure is read through the bit line, or data information is written into the capacitor structure through the bit line for storage.

In the manufacturing process of the bit line, a conductive layer and a dielectric layer are sequentially formed on the substrate, and the dielectric layer is patterned. Multiple spaced bit line structures are formed on the substrate by etching, and a sidewall isolation structure for isolating each bit line is covered on the bit line structure. During the manufacturing process of the bit line, the bit line is prone to collapse or bend, which affects the storage performance of the DRAM.

SUMMARY

An embodiment of the present application provides the following technical solution:

An embodiment of the present application provides a manufacturing method of a semiconductor structure. The manufacturing method includes:
  providing a substrate, where the substrate includes multiple active regions and an isolation structure for isolating each of the active regions; the multiple active regions are arranged in several columns along a first direction;
  forming multiple spaced first isolation sidewall structures on the substrate, where first opening regions are formed between adjacent first isolation sidewall structures, and each of the first opening regions is used to expose at least two columns of active regions;
  forming a conductive layer on the substrate located in the first opening regions, where a height of the conductive layer is lower than heights of the first isolation sidewall structures; and
  removing part of the conductive layer located in the first opening region to form two spaced bit line structures, where the two bit line structures are respectively in contact with one of the two first isolation sidewall structures forming the first opening region.

The present application provides a manufacturing method of a semiconductor structure. The present application describes the technical problems solved by the embodiments of the present application, the technical features constituting the technical solutions and the beneficial effects brought about by the technical features of these technical solutions. In addition, other technical problems to be solved by the embodiments of the present application, other technical features included in the technical solutions and beneficial effects brought about by these technical features will be described in further detail in the detailed description.

Figure 1:
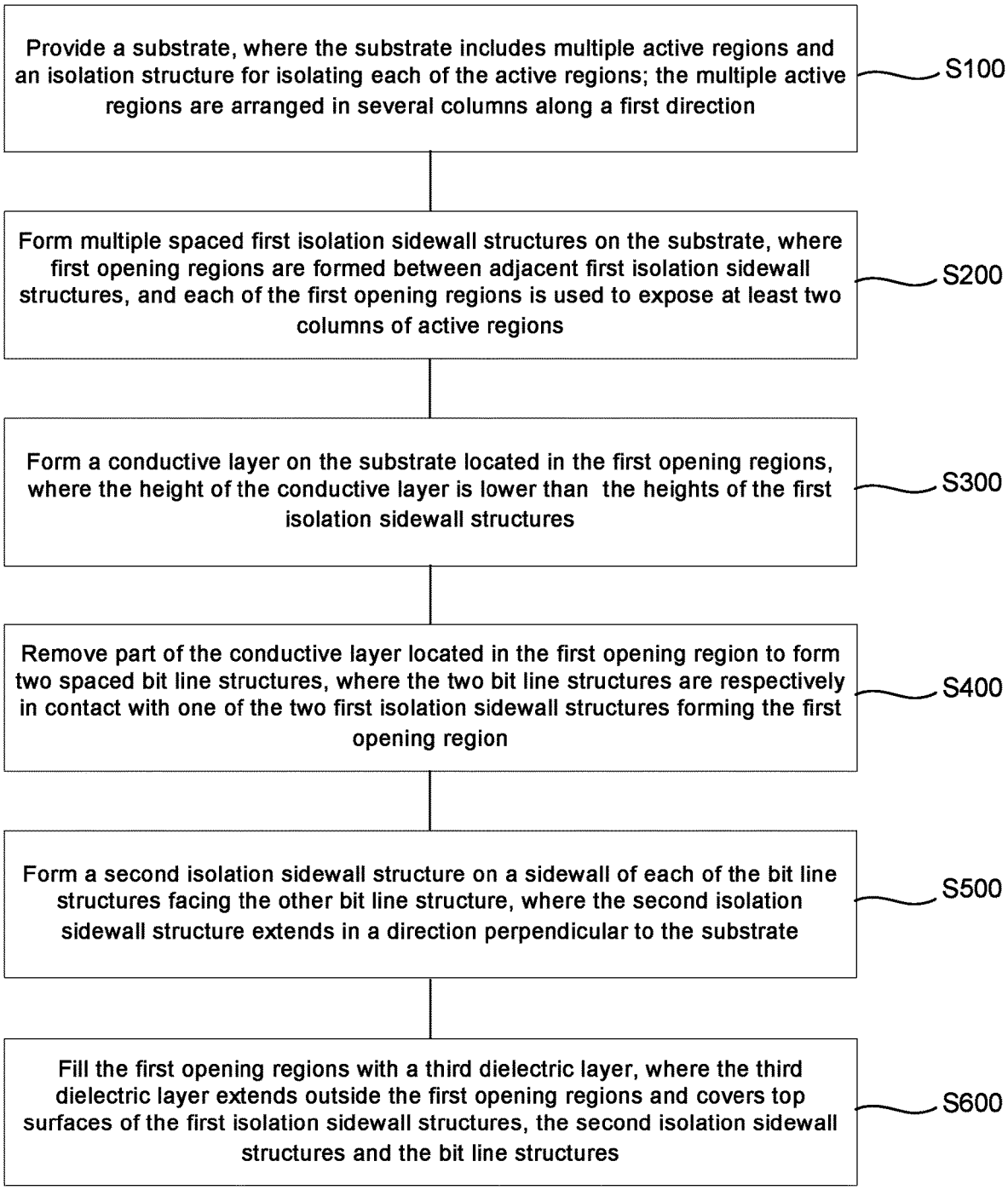
FIG. 1 is a flowchart of a manufacturing method of a semiconductor structure according to an embodiment of the present application.

REFERENCE NUMERALS 10. substrate;
11. active region;
12. isolation structure;
20. first isolation sidewall structure;
21. first opening region;
22. first isolation structure;
221. first isolation layer;
222. second isolation layer;
223. third isolation layer;
23. first dielectric layer;
231. recess;
24. barrier layer;
25. second dielectric layer;
30. sacrificial layer;
31. isolation portion;
32. isolation region;
40. photoresist layer;
41. second opening region;
42. shielding region;
50. conductive layer;
51. first conductive layer;
52. second conductive layer;
53. third conductive layer;
60. bit line structure;
70. second isolation sidewall structure;
71. fourth isolation layer;
72. fifth isolation layer;
73. sixth isolation layer;
80. third dielectric layer.

DETAILED DESCRIPTION

In the manufacturing process of the bit line structure, a conductive layer and a dielectric layer are typically stacked in sequence on a substrate, then multiple spaced bit line structures are formed on the substrate by etching, and finally a sidewall isolation structure for isolating each bit line is covered on the bit line structure. With the development of the miniaturization of the semiconductor structure, the bit line structure has a large aspect ratio. During the etching process, the upper part of the bit line structure is etched inward, such that the upper part of the bit line structure forms an inverted trapezoid. With the progress of the etching process, the conductive layer located at the lower part will be over-etched and dented inward, which makes the bit line prone to collapse or bend, thereby affecting the storage performance of the semiconductor structure.

In order to solve the above technical problem, an embodiment of the present application provides a manufacturing method of a semiconductor structure and a semiconductor structure. Multiple spaced first isolation sidewall structures are formed on the substrate. A first opening region for exposing at least two columns of active regions is formed between two adjacent first isolation sidewall structures. A conductive layer is formed in the first opening region, and at least two spaced bit line structures are formed in the first opening region through a self-aligned etching process. The first isolation sidewall structure provides support for the conductive layer located in the first opening region, which prevents the bit line structure from tilting or collapsing during the subsequent etching process, thereby improving the storage performance of the semiconductor structure.

In order to make the objectives, features and advantages of the embodiments of the present application clearer, the technical solutions in the embodiments of the present application are described clearly and completely below with reference to the accompanying drawings in the embodiments of the present application. Apparently, the described embodiments are some rather than all of the embodiments of the present application. All other embodiments obtained by a person of ordinary skill in the art based on the embodiments of present application without creative efforts should fall within the protection scope of this application.

FIG. 1 is a flowchart of the manufacturing method of a semiconductor structure according to an embodiment of the present application, and FIGS. 2 to 19 are schematic structural diagrams of various steps of the manufacturing method of a semiconductor structure. The manufacturing method of a semiconductor structure is described below with reference to FIGS. 1 to 19.

The semiconductor structure is not limited in this embodiment. The semiconductor structure is described below by taking a dynamic random access memory (DRAM) as an example, but this embodiment is not limited to this, and the semiconductor structure in this embodiment may also be other structure.

As shown in FIG. 1, an embodiment of the present application further provides a manufacturing method of a semiconductor structure. The manufacturing method includes:

S100: Provide a substrate, where the substrate includes multiple active regions and an isolation structure for isolating each of the active regions; the multiple active regions are arranged in several columns along a first direction.

Figure 2:
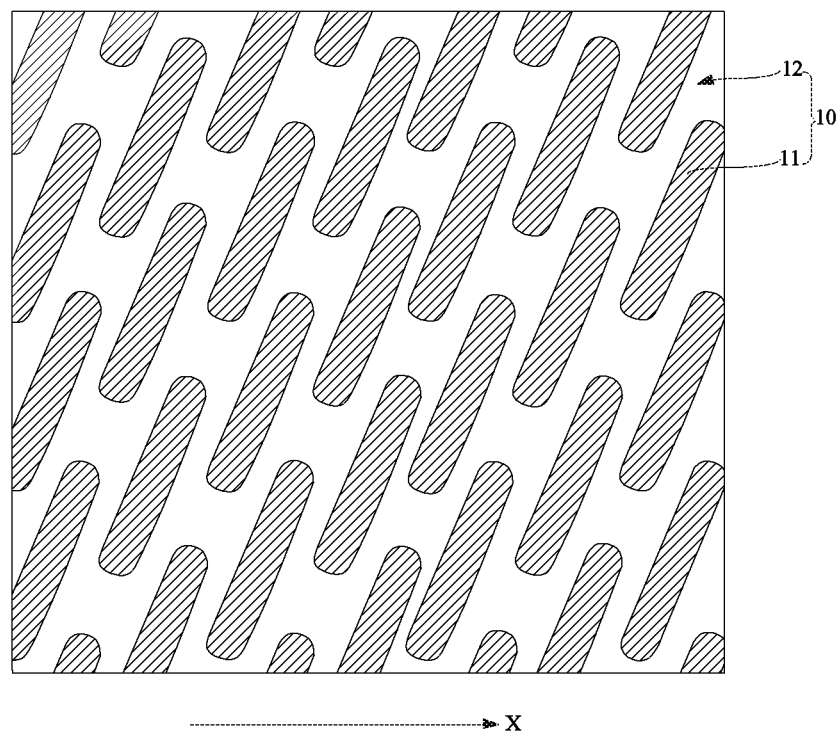
FIG. 2 is a schematic structural diagram of a substrate used by the manufacturing method of a semiconductor structure according to an embodiment of the present application.

Exemplarily, referring to FIG. 2, the substrate 10 serves as a support member of the semiconductor structure for supporting other components provided thereon. The substrate 10 includes multiple active regions 11 and an isolation structure 12 for isolating each of the active regions 11. The isolation structure 12 can realize the insulation between the active regions 11.

The multiple active regions 11 may be arranged in several columns along the first direction. The first direction may be a row direction, that is, an X direction shown in FIG. 2. An extending direction of the multiple active regions 11 may vary. For example, the active regions 11 may extend along a column direction. Alternatively, the extending direction of the active regions 11 may be at a certain angle with the column direction or the row direction.

Figure 3:
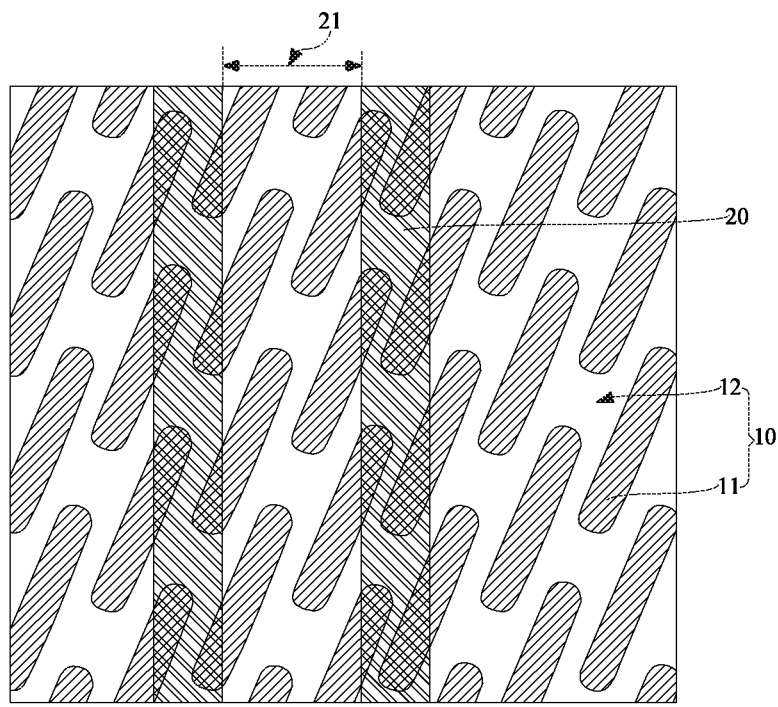
FIG. 3 is a distribution diagram of first isolation sidewalls formed by the manufacturing method of a semiconductor structure according to an embodiment of the present application.

S200: Form multiple spaced first isolation sidewall structures on the substrate, where first opening regions are formed between adjacent first isolation sidewall structures, and each of the first opening regions is used to expose at least two columns of active regions, as shown in FIGS. 3 and 4.

This step may be implemented as follows:

A sacrificial layer 30 and a photoresist layer 40 are sequentially stacked on the substrate 10. For example, a sacrificial layer 30 of a certain thickness may be formed on the substrate 10 through an atomic layer deposition (ALD) process or a chemical vapor deposition (CVD) process, and a photoresist layer 40 of a certain thickness may be coated on a side of the sacrificial layer 30 away from the substrate 10. Exemplarily, the sacrificial layer 30 in this embodiment may be made of silicon oxide.

Figure 4:
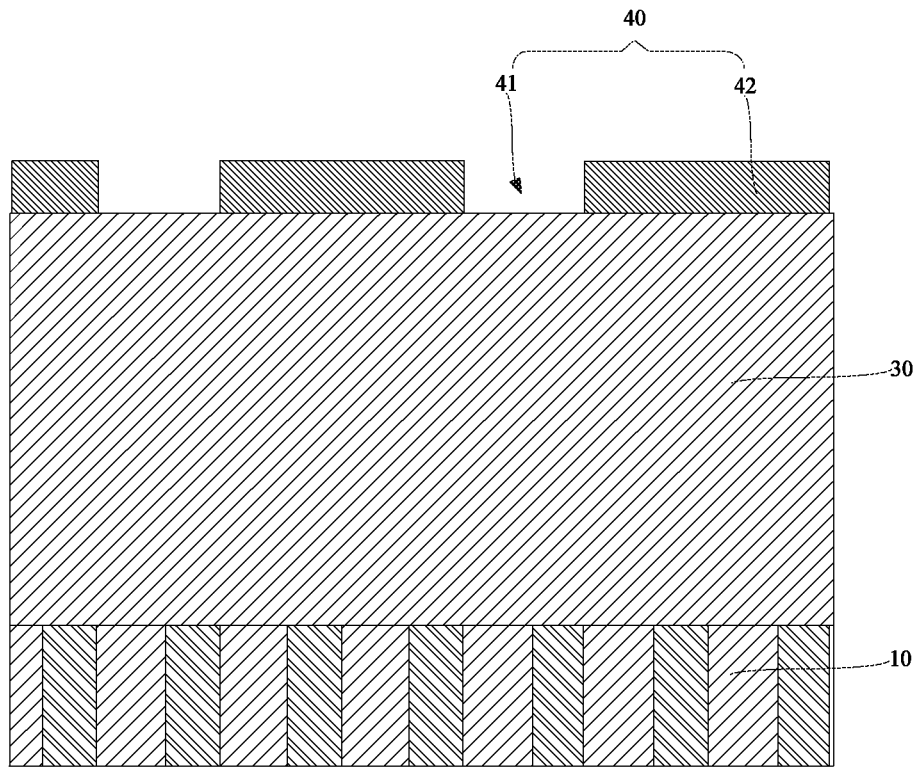
FIG. 4 is a first schematic structural diagram of a sacrificial layer and a photoresist layer formed by the manufacturing method of a semiconductor structure according to an embodiment of the present application.
Figure 5:
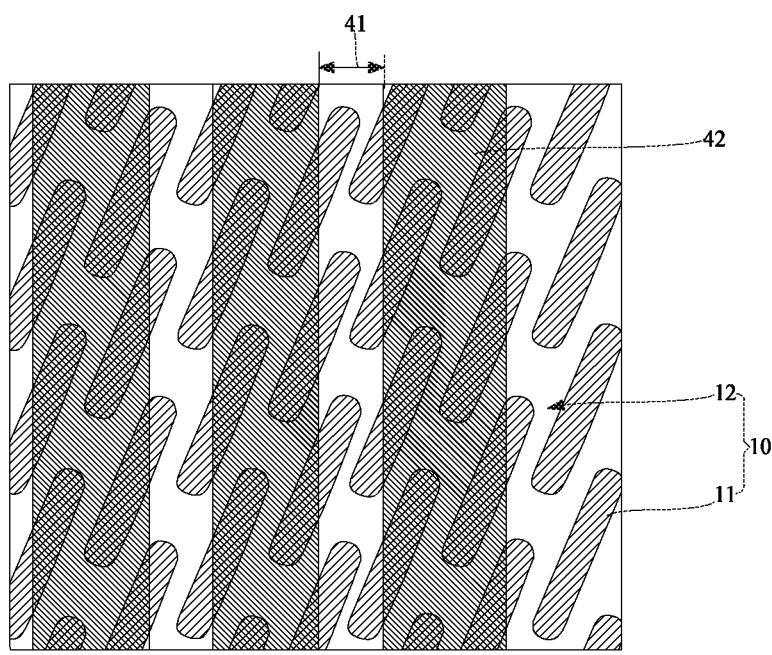
FIG. 5 is a second schematic structural diagram of the sacrificial layer and the photoresist layer formed by the manufacturing method of a semiconductor structure according to an embodiment of the present application.

As shown in FIGS. 4 and 5, the photoresist layer 40 is patterned to form multiple second opening regions 41 and multiple shielding regions 42 for isolating each of the second opening regions 41 in the photoresist layer 40. A projection of each of the shielding regions 42 on the substrate 10 overlaps with at least two columns of active regions 11.

The projection of the shielding region 42 on the substrate is a rectangle, and left and right sides of the rectangle respectively pass through the center of a column of active regions 11. In this way, a subsequently formed bit line structure will pass through the center of the column of active regions 11, such that the semiconductor structure can quickly read or store data information.

Figure 6:
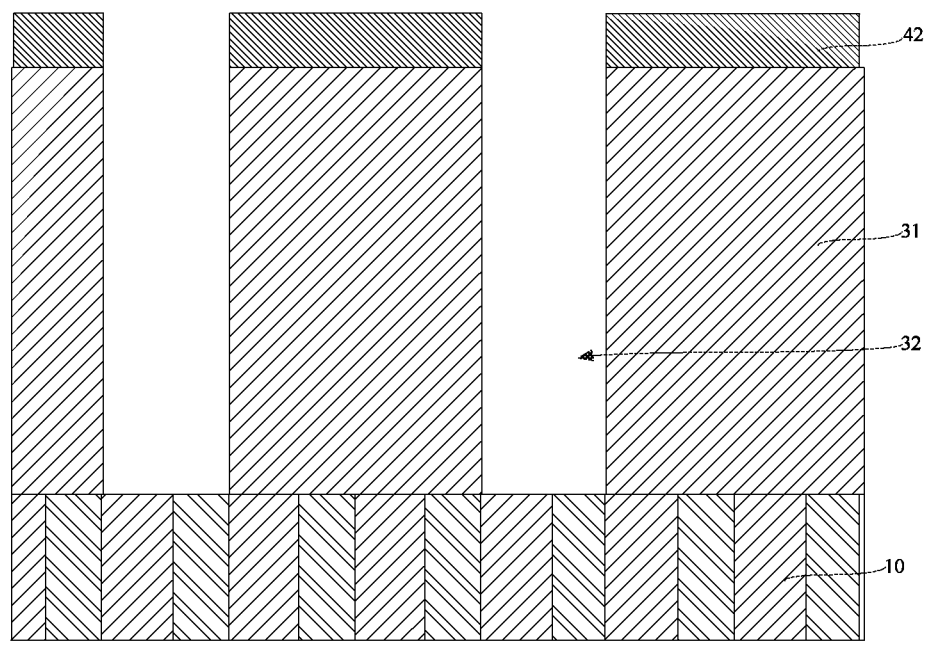
FIG. 6 is a schematic structural diagram of removing part of the sacrificial layer by the manufacturing method of a semiconductor structure according to an embodiment of the present application.

As shown in FIG. 6, the sacrificial layer 30 located in the second opening regions 41 is removed, and the sacrificial layer 30 located below the shielding regions 42 is retained. The sacrificial layer 30 located below the shielding regions 42 forms isolation portions 31, and isolation regions 32 are formed between adjacent isolation portions 31.

In this step, a dry etching process may be used to remove the sacrificial layer 30 located in the second opening regions 41 and retain the sacrificial layer 30 located below the shielding regions 42. In this way, multiple spaced isolation portions 31 are formed on the substrate 10, and isolation regions 32 are formed between adjacent isolation portions 31. The isolation region 32 is used to expose at least two columns of active regions 11.

Correspondingly, first isolation sidewall structures 20 are formed in the isolation regions 32, and each of the first isolation sidewall structure 20 can pass through at least two columns of active regions 11. In this way, a conductive layer subsequently formed between adjacent first isolation sidewall structures 20 may cover at least two columns of active regions 11, such that the conductive layer located between the adjacent first isolation sidewall structures 20 may form at least two independent bit line structures.

In the related art, a single bit line structure is formed on the substrate through an etching process. In comparison, in this embodiment, multiple spaced first isolation sidewall structures are formed on the substrate. A first opening region for exposing at least two columns of active regions is formed between two adjacent first isolation sidewall structures. A conductive layer is formed in the first opening region, and at least two spaced bit line structures are formed in the first opening region through a self-aligned etching process. The first isolation sidewall structure provides support for the conductive layer located in the first opening region, which prevents the bit line structure from tilting or collapsing during the subsequent etching process, thereby improving the storage performance of the semiconductor structure.

Further, the first isolation sidewall structures are formed in the isolation regions as follows:

Form a first isolation structure 22 on sidewalls of the isolation regions 32, bottom walls of the isolation regions 32 and top surfaces of the isolation portions 31, where the first isolation structure 22 may be a single film layer or a composite film layer.

Exemplarily, the first isolation structure 22 includes a first isolation layer 221, a second isolation layer 222 and a third isolation layer 223 that are sequentially stacked. The third isolation layer 223 is in contact with a first dielectric layer 23. The first isolation layer 221 is made of the same material as the third isolation layer 223, for example, silicon nitride. The second isolation layer 222 is made of a different material from the first isolation layer 221, for example, silicon oxide.

Figure 7:
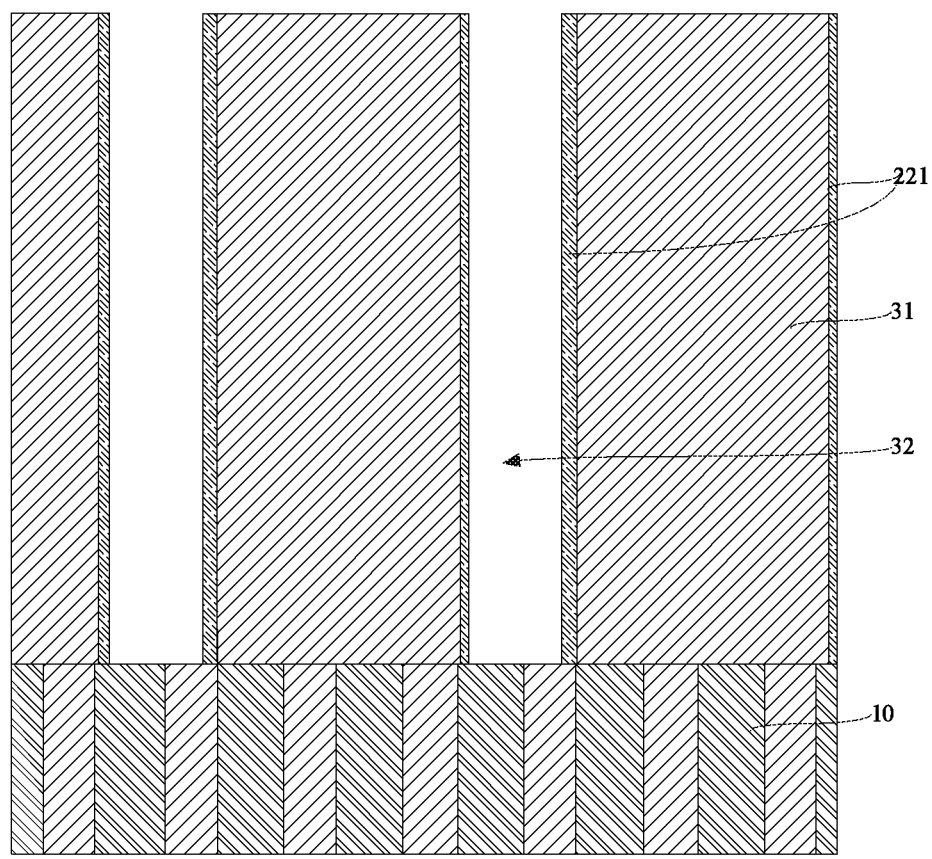
FIG. 7 is a first process diagram of forming the first isolation sidewall by the manufacturing method of a semiconductor structure according to an embodiment of the present application.

As shown in FIG. 7, the first isolation layer 221 is formed on a sidewall of one isolation portion 31 facing the other isolation portion 31, that is, the first isolation layer 221 is formed on the sidewalls of the isolation regions 32.

Specifically, an ALD process may be used to deposit a first silicon nitride layer of a certain thickness on the bottom walls of the isolation regions 32 and the sidewalls and top surfaces of the isolation portions 31. Then, a dry etching process is used to remove the first silicon nitride layer located on the bottom walls of the isolation regions 32 and the top surfaces of the isolation portions 31 and retain the first silicon nitride layer on the sidewalls of the isolation portions 31, thereby forming the first isolation layer 221.

In this process, an etching gas used for the dry etching may be $SIH_4$, $NH_3$ or a mixed gas of $N_2$ and $H_2$.

Figure 8:
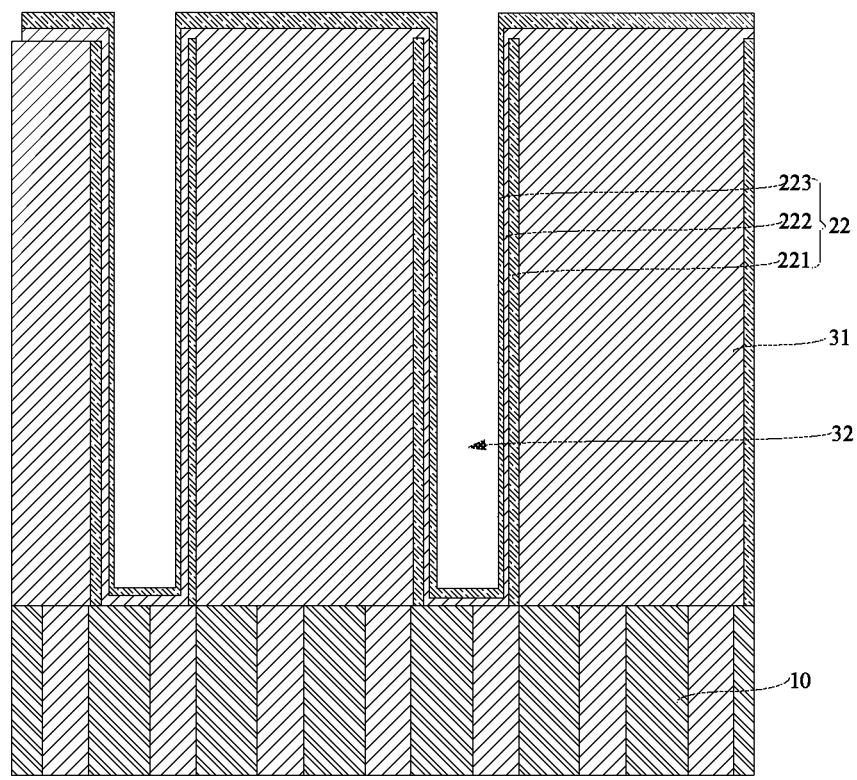
FIG. 8 is a second process diagram of forming the first isolation sidewall by the manufacturing method of a semiconductor structure according to an embodiment of the present application.

As shown in FIG. 8, a silicon oxide layer and a second silicon nitride layer are sequentially formed on a sidewall of the first isolation layer 221, the bottom walls of the isolation regions 32 and the top surfaces of the isolation portions 31 through an ALD process.

In this step, all the above silicon oxide layers and all the second silicon nitride layers may form the second isolation layer 222 and the third isolation layer 223, respectively.

Figure 9:
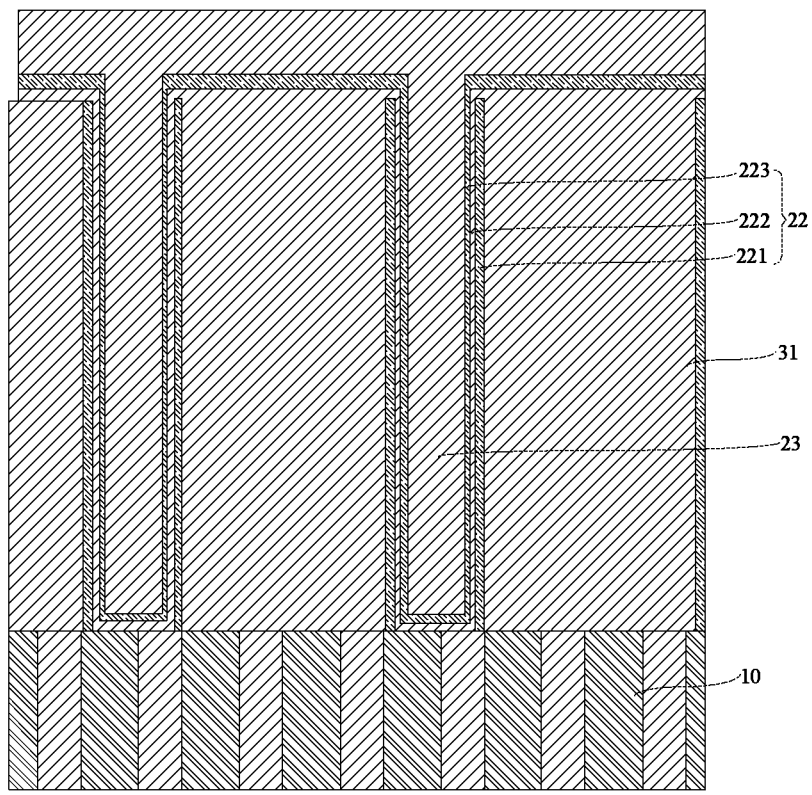
FIG. 9 is a third process diagram of forming the first isolation sidewall by the manufacturing method of a semiconductor structure according to an embodiment of the present application.

As shown in FIG. 9, the first dielectric layer 23 is formed on the first isolation structure 22, and the first dielectric layer 23 fills the isolation regions 32. In other words, the first dielectric layer 23 is formed in the isolation regions 32, and the first dielectric layer 23 extends outside the isolation regions 32 and covers the top surface of the first isolation structure 22. The first dielectric layer 23 is made of silicon oxide.

In this step, the isolation regions 32 may be filled with liquid silicon oxide by spin coating, and the liquid silicon oxide may be cured by heat treatment to form the first dielectric layer 23 filling the isolation regions 32 and covering the top surface of the first isolation structure 22.

Figure 10:
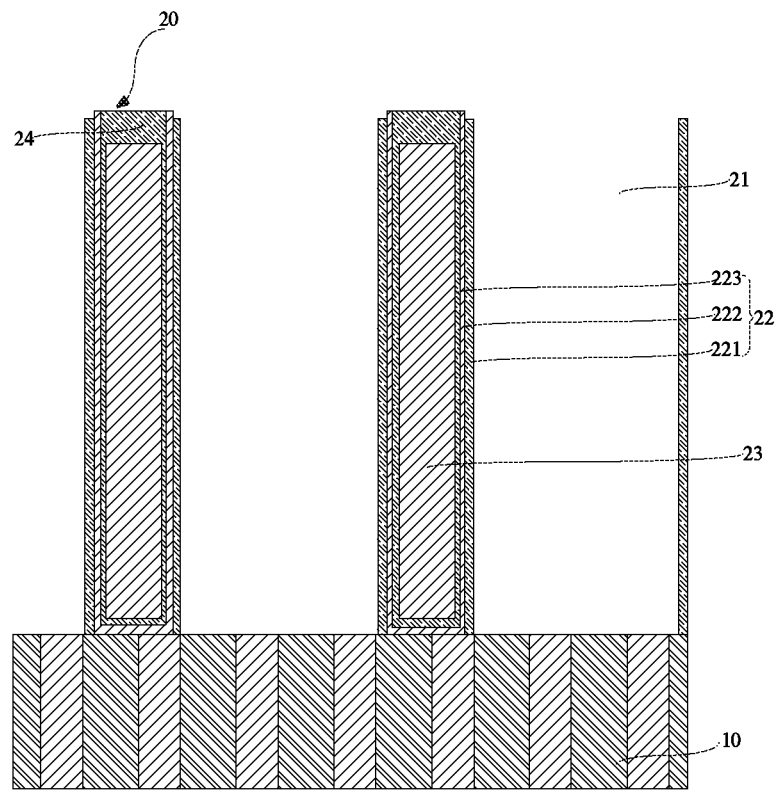
FIG. 10 is a fourth process diagram of forming the first isolation sidewall by the manufacturing method of a semiconductor structure according to an embodiment of the present application.

Finally, the isolation portions and the first isolation structure and the first dielectric layer on the top surfaces of the isolation portions are removed, and the retained first isolation structure and first dielectric layer form the first isolation sidewall structures, as shown in FIG. 10.

Figure 11:
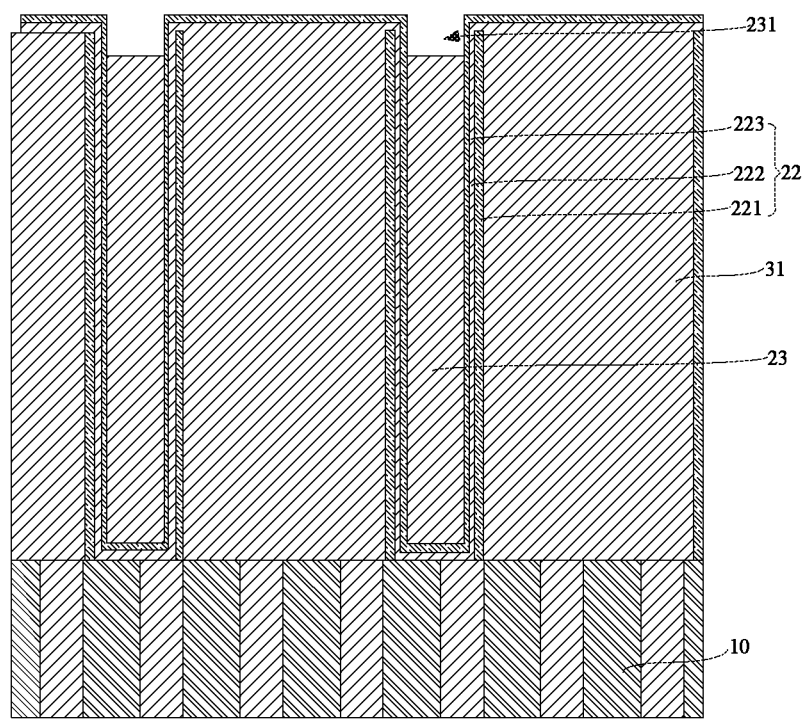
FIG. 11 is a structural diagram of etching back a first dielectric layer by the manufacturing method of a semiconductor structure according to an embodiment of the present application.

Specifically, the isolation portions may be removed as follows:

As shown in FIG. 11, the first dielectric layer 23 is etched back to remove the first dielectric layer 23 on the top surface of the first isolation structure 22 and part of the first dielectric layer 23 located in the isolation regions 32. In this way, the first dielectric layer 23 located in the isolation regions 32 forms recesses 231. The depths of the recesses 231 are 1-3 times the thickness of the third isolation layer 223 contacting the first dielectric layer 23, that is, the depths of the recesses 231 are 1-3 times the thickness of the second silicon nitride layer.

In this step, the third isolation layer 223 on the top surfaces of the isolation portions 31 is used as an etching barrier layer to etch the first dielectric layer 23, such that the first dielectric layer located in the isolation regions 32 forms the recesses 231.

Figure 12:
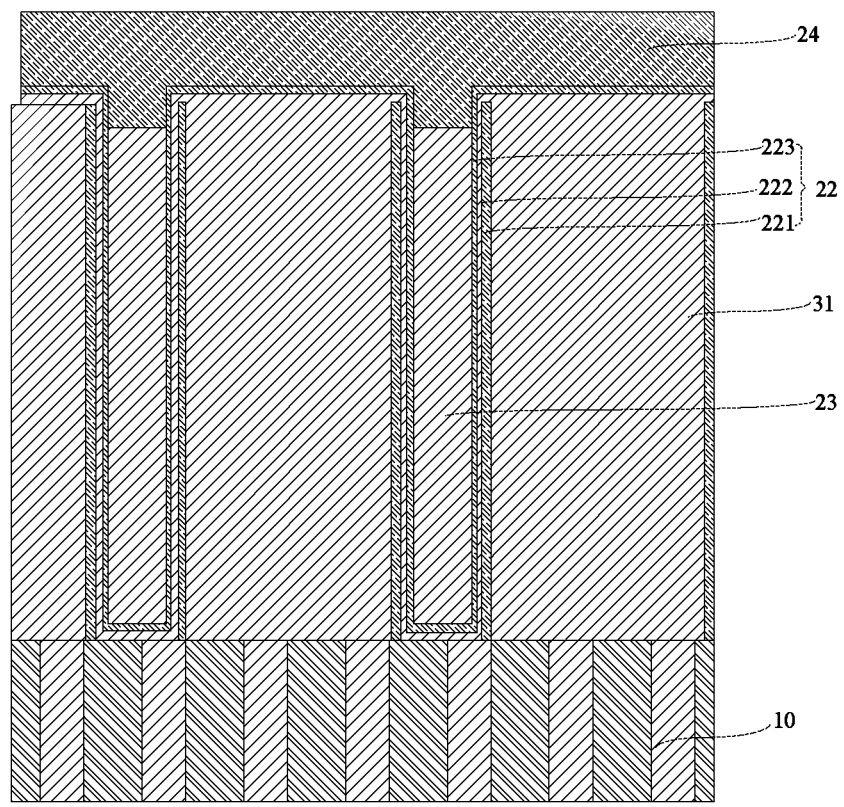
FIG. 12 is a structural diagram of forming a barrier layer by the manufacturing method of a semiconductor structure according to an embodiment of the present application.

As shown in FIG. 12, a barrier layer 24 is formed in the recesses 231. The barrier layer 24 extends to the outside of the recesses 231 and covers a top surface of the third isolation layer 223. The barrier layer 24 is made of silicon nitride.

Specifically, part of the barrier layer 24 and the third isolation layer 223 on the top surfaces of the isolation portions 31 are etched away by dry etching, such that the barrier layer located in the recesses 231 is flush with the second isolation layer 222 located on the top surfaces of the isolation portions 31.

Then, the barrier layer located in the recesses 231 is used as an etching stop layer to remove the isolation portions 31 and the second isolation layer 222 on the top surfaces of the isolation portions 31 by dry etching or wet etching, so as to form multiple spaced first isolation sidewall structures 20 on the substrate 10, as shown in FIG. 10.

It should be noted that in the process of etching the isolation portions 31, an etching gas used for dry etching may be at least one of $SF_6$, $CF_4$, $CHF_3$, $O_2$ and Ar.

In this embodiment, a first opening region 21 may be formed between adjacent first isolation sidewall structures 20, and the first opening region 21 is used to expose at least two columns of active regions 11. The conductive layer formed in the first opening region 21 may be divided into two independent bit line structures. In this way, the first isolation sidewall structure 20 provides support for the conductive layer located in the first opening region 21 to prevent the conductive layer from tilting or collapsing in the subsequent etching process, thereby improving the storage performance of the semiconductor structure.

S300: Form a conductive layer on the substrate located in the first opening regions, where the height of the conductive layer is lower than the heights of the first isolation sidewall structures.

Exemplarily, a first conductive layer 51 is formed on the substrate 10 located in the first opening regions 21, and the height of the first conductive layer 51 is lower than the heights of the first isolation sidewall structures 20.

Figure 13:
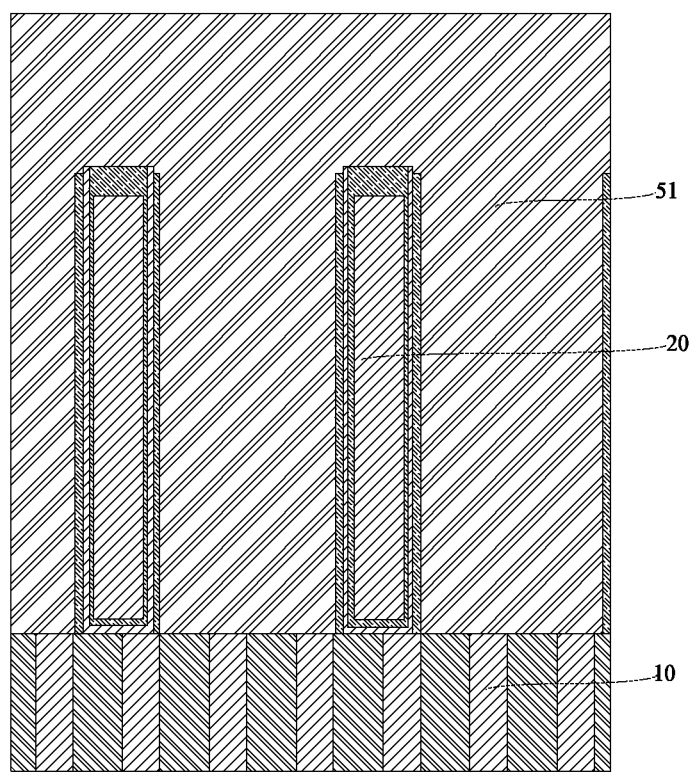
FIG. 13 is a first schematic structural diagram of forming a first conductive layer by the manufacturing method of a semiconductor structure according to an embodiment of the present application.

In this step, as shown in FIG. 13, a low pressure chemical vapor deposition (LPCVD) process may be used to form a polysilicon layer on the substrate 10 located in the first opening regions 21. The polysilicon layer extends outside the first opening regions 21 and covers the top surfaces of the first isolation sidewall structures 20.

Specifically, silane ($SIH_4$) and phosphine ($PH_3$) are introduced into a reaction device, and the reaction temperature in the reaction device is controlled at 480-520° C., such that the silane ($SiH_4$) and phosphide ($PH_3$) are reacted to form phosphorus-doped silicon (Si) and hydrogen ($H_2$), thereby making the polysilicon layer conductive.

Figure 14:
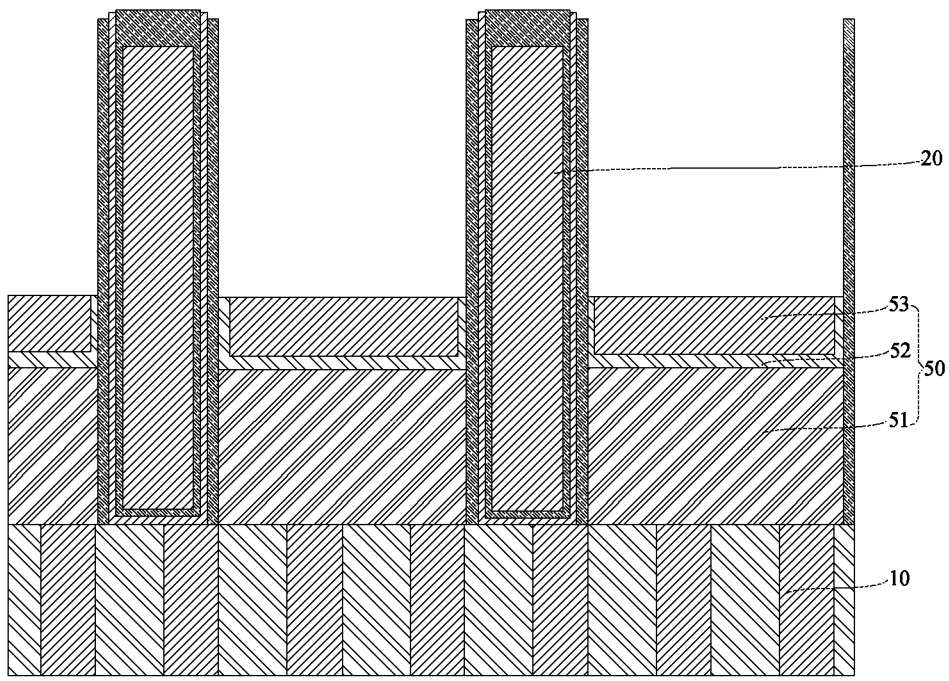
FIG. 14 is a second schematic structural diagram of forming the first conductive layer by the manufacturing method of a semiconductor structure according to an embodiment of the present application.

The polysilicon layer is etched back. As shown in FIG. 14, part of the polysilicon layer located in the first opening regions 21 and the polysilicon layer located on the top surfaces of the first isolation sidewall structures 20 are removed, and the remaining part of the polysilicon layer located in the first opening regions 21 is retained, so as to form the first conductive layer 51.

A second conductive layer 52 and a third conductive layer 53 are formed on the first conductive layer 51.

In this step, the second conductive layer 52 may be formed on the sidewalls and top surfaces of the first isolation sidewall structures 20 and a top surface of the first conductive layer 51 through an ALD process. The second conductive layer 52 is made of titanium nitride.

Then, a third conductive layer 53 is deposited in the first opening regions 21. The third conductive layer 53 extends outside the first opening regions 21 to cover the second conductive layer 52 on the top surfaces of the first isolation sidewall structures 20. The third conductive layer 53 is made of tungsten.

The second conductive layer 52 and the third conductive layer 53 are etched back such that the height of the second conductive layer 52 and the third conductive layer 53 is lower than the heights of the first isolation sidewall structures 20. The first conductive layer 51, the second conductive layer 52 and the third conductive layer 53 form a conductive layer 50.

S400: Remove part of the conductive layer located in the first opening region to form two spaced bit line structures, where the two bit line structures are respectively in contact with one of the two first isolation sidewall structures forming the first opening region.

Figure 15:
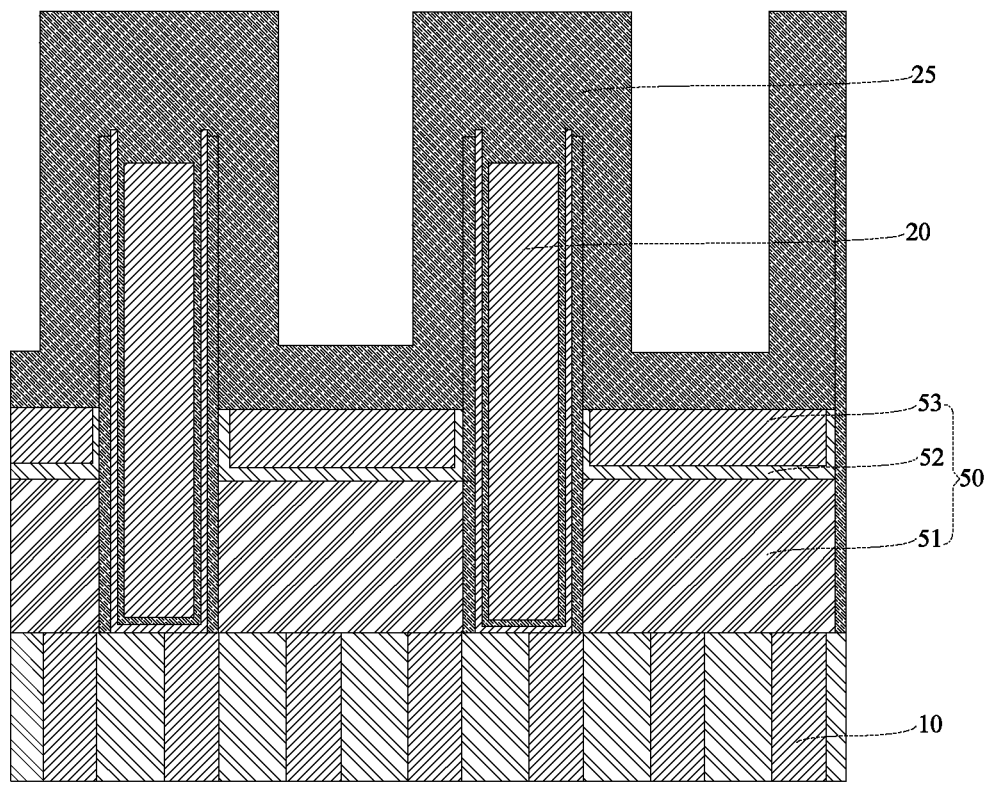
FIG. 15 is a schematic structural diagram of forming a second dielectric layer by the manufacturing method of a semiconductor structure according to an embodiment of the present application.

Exemplarily, a second dielectric layer is formed on the sidewalls and the top surfaces of the first isolation sidewall structures located on an upper part of the conductive layer and the top surface of the conductive layer, as shown in FIG. 15.

Specifically, an ALD process is used to form a second dielectric layer 25 on the sidewalls of the first opening regions 21, a top surface of the conductive layer 50 and the top surfaces of the first isolation sidewall structures 20, such that the second dielectric layer 25 is U-shaped in the first opening regions 21. The second dielectric layer 25 is made of silicon nitride.

The second dielectric layer 25 is used as a mask to vertically etch, by dry etching, part of the second dielectric layer 25 on the top surfaces of the first isolation sidewall structures 20, the second dielectric layer 25 at the bottoms of the U-shaped structures, and the first conductive layer 51, the second conductive layer 52 and the third conductive layer 53 that are shielded by the bottoms of the U-shaped structures. In this way, two spaced bit line structures 60 are formed in the first opening region 21.

Figure 16:
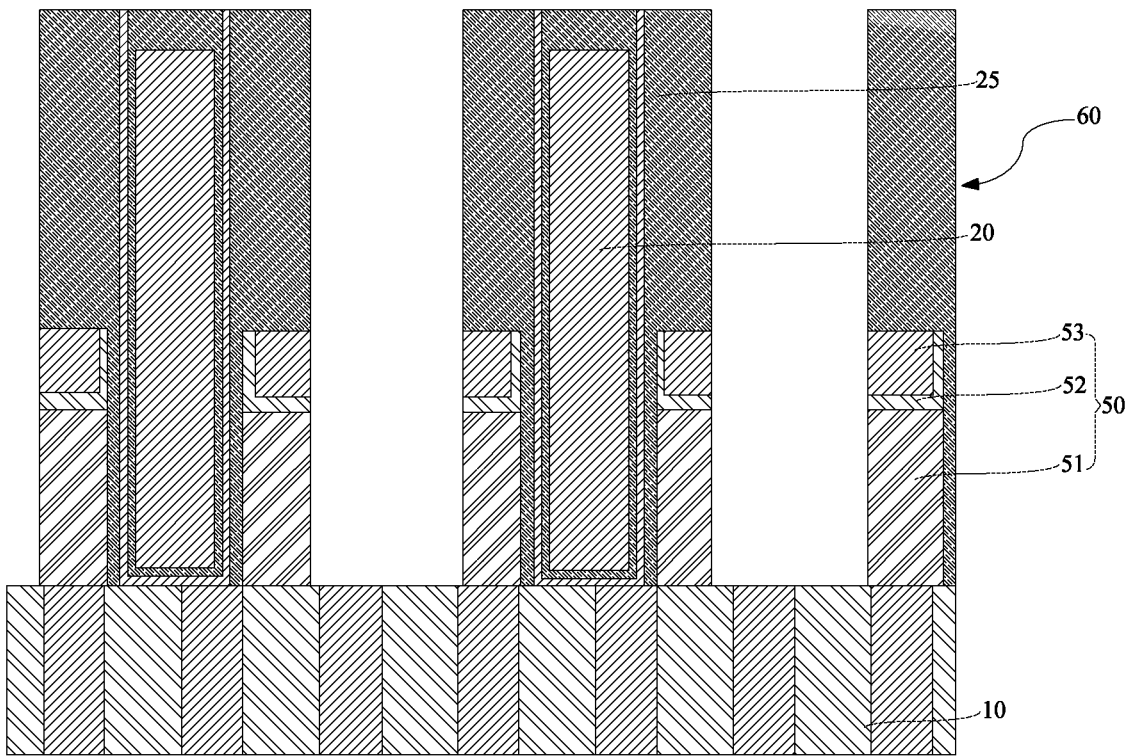
FIG. 16 is a schematic diagram of forming a bit line structure by the manufacturing method of a semiconductor structure according to an embodiment of the present application.

Taking the orientation shown in FIG. 16 as an example, for two bit line structures 60 located in the same first opening region 21, one bit line structure 60 is in contact with a right sidewall of one first isolation sidewall structure 20, and the other bit line structure 60 is in contact with a left sidewall of the other first isolation sidewall structure 20.

In this embodiment, the thickness of the second dielectric layer 25 is equal to the widths of the bit line structures 60 to be formed. The thickness of the second dielectric layer 25 can be precisely controlled so as to control the widths of the bit line structures to be formed subsequently and facilitate the subsequent formation of the bit line structures 60 through a self-aligned process.

S500: Form a second isolation sidewall structure on the sidewall of each of the bit line structures facing the other bit line structure, where the second isolation sidewall structure extends in a direction perpendicular to the substrate.

That is to say, for two bit line structures 60 located in the same first opening region 21, a second isolation sidewall structure 70 is formed on a left sidewall of one bit line structure 60 and on a right sidewall of the other bit line structure 60, respectively.

It should be noted that the sidewall of the bit line structure in this embodiment may refer to the left sidewall of one bit line or the right sidewall of the other bit line structure, that is, the sidewall of the bit line structure away from the first isolation sidewall structure.

Exemplarily, the second isolation sidewall structure 70 includes a fourth isolation layer 71, a fifth isolation layer 72 and a sixth isolation layer 73 that are sequentially formed on the sidewall of the bit line structure. The fourth isolation layer 71 and the sixth isolation layer 73 are made of the same material, and the fourth isolation layer 71 and the fifth isolation layer 72 are made of different materials.

Specifically, an ALD process may be used to form a silicon nitride layer with a thickness of 1-2 nm on sidewalls and top surfaces of the bit line structures 60, the bottom walls of the first opening regions 21 and the top surfaces of the first isolation sidewall structures 20 between two bit line structures 60.

Figure 17:
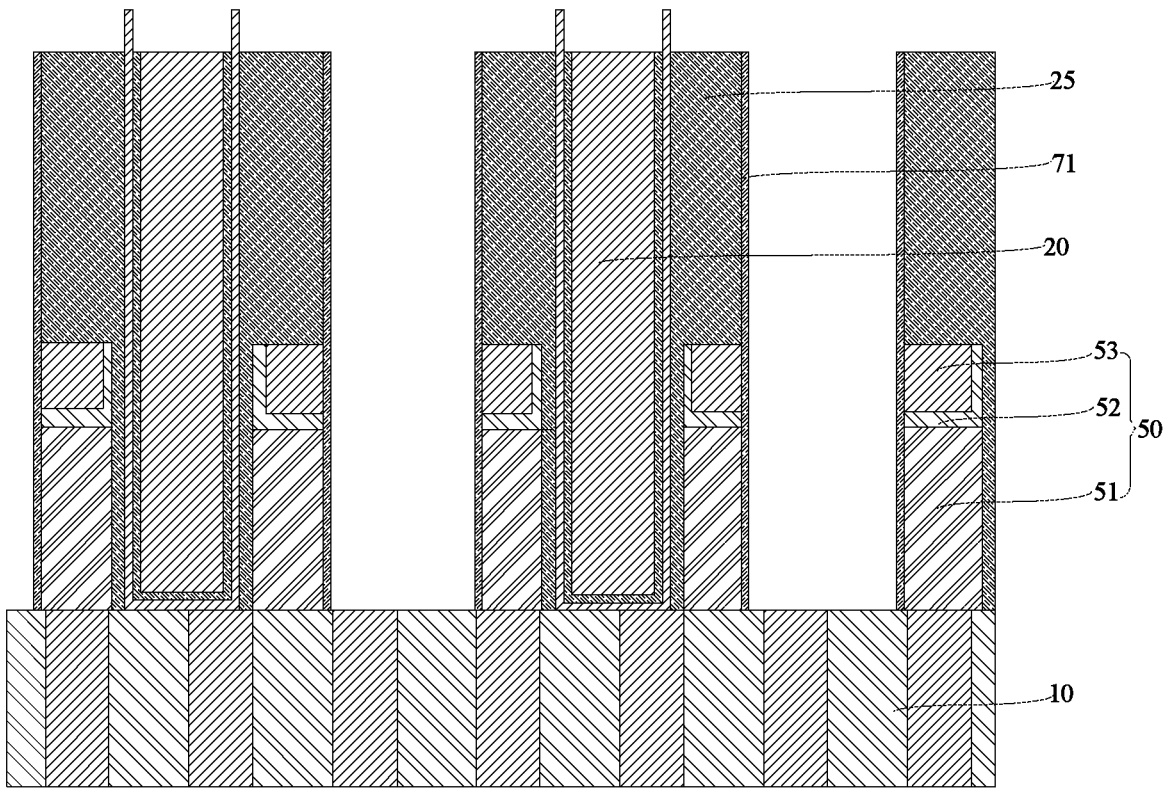
FIG. 17 is a first schematic diagram of forming a second isolation sidewall structure by the manufacturing method of a semiconductor structure according to an embodiment of the present application.

As shown in FIG. 17, the silicon nitride layer on the top surfaces of the bit line structures 60 and the first isolation sidewall structures 20 and the silicon nitride layer on the bottom walls of the first opening regions 21 are etched away by dry etching. In this way, the first dielectric layer 23 of the first isolation sidewall structures 20 is exposed, and the silicon nitride layer on the sidewalls of the bit line structures 60 is retained to form the fourth isolation layer 71.

Figure 18:
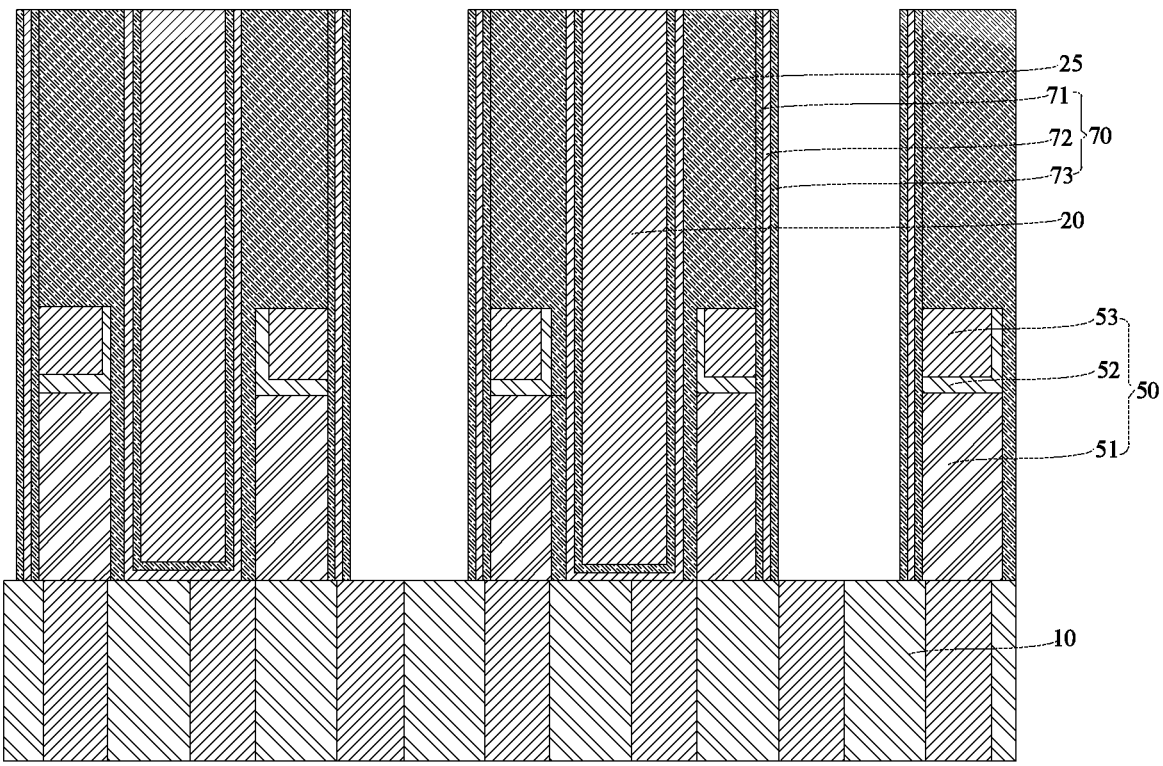
FIG. 18 is a second schematic diagram of forming the second isolation sidewall structure by the manufacturing method of a semiconductor structure according to an embodiment of the present application.

Then, as shown in FIG. 18, a fifth isolation layer 72 and a sixth isolation layer 73 are sequentially deposited in the first opening regions 21. The fifth isolation layer 72 is made of silicon oxide and has a thickness of 2-3 nm; the sixth isolation layer is made of silicon nitride and has a thickness of 2-3 nm.

It should be noted that the fifth isolation layer 72 and the sixth isolation layer 73 are formed in the same manner as the fourth isolation layer 71, and will not be repeated in this embodiment.

Figure 19:
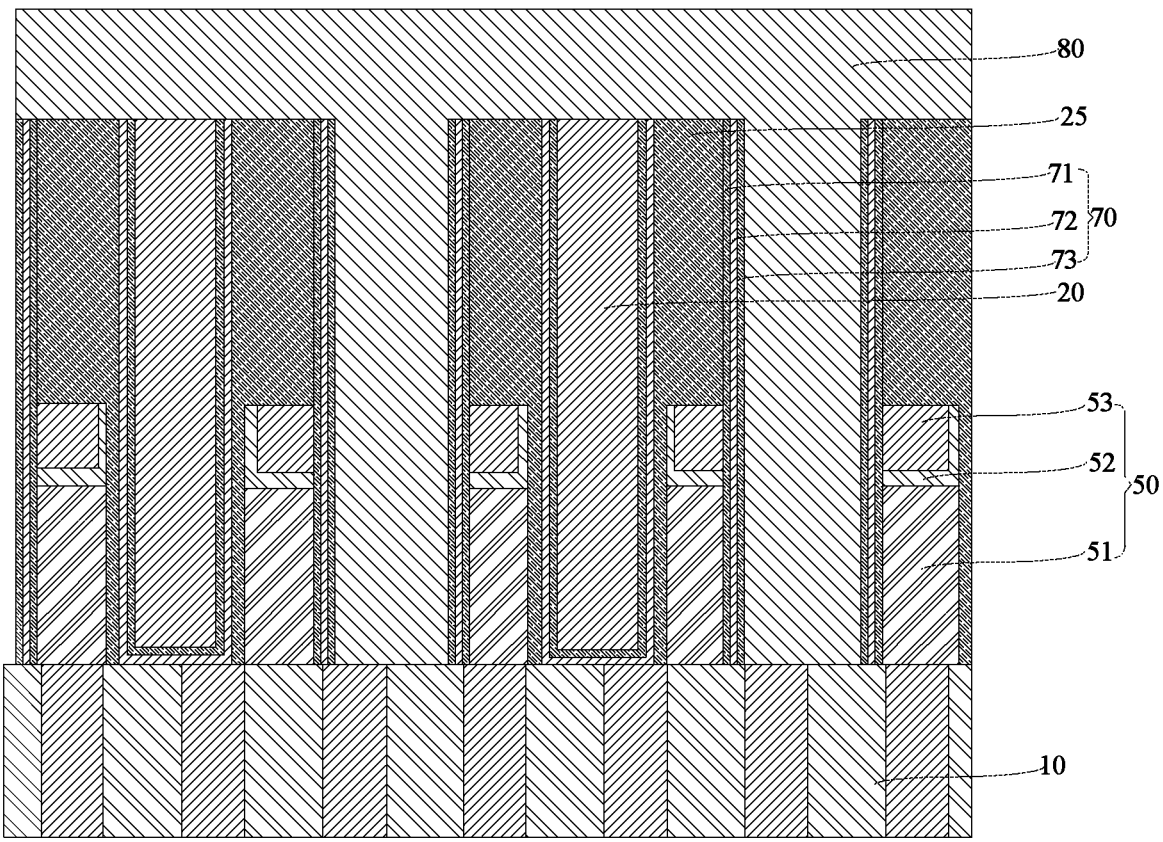
FIG. 19 is a schematic diagram of forming a third dielectric layer by the manufacturing method of a semiconductor structure according to an embodiment of the present application.

S600: Fill the first opening regions with a third dielectric layer, where the third dielectric layer extends outside the first opening regions and covers the top surfaces of the first isolation sidewall structures, the second isolation sidewall structures and the bit line structures, as shown in FIG. 19.

In the step, the liquid silicon oxide may be filled in the first opening regions by spin coating, and the liquid silicon oxide may be cured by heat treatment, so as to form a third dielectric layer 80 filling the first opening regions 21.

Finally, the third dielectric layer 80 is planarized through a chemical-mechanical planarization process, so as to facilitate the subsequent manufacturing of a capacitor on the third dielectric layer 80.

An embodiment of the present application further provides a semiconductor structure. As shown in FIG. 19, the semiconductor structure includes a substrate 10 and multiple first isolation sidewall structures 20. The multiple first isolation sidewall structures 20 are spaced on the substrate 10, and each first isolation sidewall structure 20 is provided with a bit line structure 60 and a second isolation sidewall structure 70 on two sides, respectively.

The first isolation sidewall structure 20, the bit line structure 60 and the second isolation sidewall structure 70 are manufactured by the manufacturing method of a semiconductor structure provided by any of the above embodiments.

In this embodiment, multiple spaced first isolation sidewall structures are formed on the substrate. A first opening region for exposing at least two columns of active regions is formed between two adjacent first isolation sidewall structures. A conductive layer is formed in the first opening region, and at least two spaced bit line structures are formed in the first opening region through a self-aligned etching process. The first isolation sidewall structure provides support for the conductive layer located in the first opening region, which prevents the bit line structure from tilting or collapsing during the subsequent etching process, thereby improving the storage performance of the semiconductor structure.

Each embodiment in the specification of the present application is described in a progressive manner. Each embodiment focuses on the difference from other embodiments, and the same and similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present application.

In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present application, but are not intended to limit the present application. Although the present application is described in detail with reference to the foregoing embodiments, those of ordinary skill in the art should understand that they can 10 still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A manufacturing method of a semiconductor structure, comprising:

providing a substrate, wherein the substrate comprises multiple active regions and an isolation structure for isolating each of the active regions; the multiple active regions are arranged in several columns along a first direction;

forming multiple spaced first isolation sidewall structures on the substrate, wherein first opening regions are formed between adjacent first isolation sidewall structures, and each of the first opening regions is used to expose at least two columns of active regions;

forming a conductive layer on the substrate located in the first opening regions, wherein a height of the conductive layer is lower than heights of the first isolation sidewall structures; and removing part of the conductive layer located in the first opening region to form two spaced bit line structures, wherein the two bit line structures are respectively in contact with one of the two first isolation sidewall structures forming the first opening region;

wherein the forming multiple spaced first isolation sidewall structures on the substrate comprises:

sequentially stacking a sacrificial layer and a photoresist layer on the substrate;
patterning the photoresist layer to form multiple second opening regions and multiple shielding regions for isolating each of the second opening regions in the photoresist layer, wherein a projection of each of the shielding regions on the substrate overlaps with at least two columns of active regions;
removing the sacrificial layer located in the second opening regions to retain the sacrificial layer located below the shielding regions, wherein the sacrificial layer located below the shielding regions forms isolation portions, and isolation regions are formed between adjacent isolation portions; and
forming the first isolation sidewall structures in the isolation regions;
the forming the first isolation sidewall structures in the isolation regions comprises:
forming a first isolation structure on sidewalls of the isolation regions, bottom walls of the isolation regions and top surfaces of the isolation portions;
forming a first dielectric layer on the first isolation structure, wherein the first dielectric layer fills the isolation regions; and
removing part of the first isolation structure and part of the first dielectric layer on the top surfaces of the isolation portions and the isolation portions, and retaining the first isolation structure and the first dielectric layer on the substrate, wherein the retained first isolation structure and first dielectric layer form the first isolation sidewall structures; and
the removing part of the first isolation structure and part of the first dielectric layer on the top surfaces of the isolation portions and the isolation portions comprises:
removing the first dielectric layer arranged on a top surface of the first isolation structure and part of the first dielectric layer arranged in the isolation regions, such that the first dielectric layer disposed in the isolation regions forms recesses;
forming a barrier layer in the recesses; and
using the barrier layer as a mask to remove the isolation portions and the first isolation structure on the top surfaces of the isolation portions.

2. The manufacturing method of the semiconductor structure according to claim 1, wherein forming the first isolation structure in the isolation regions comprises:
sequentially stacking a first isolation layer, a second isolation layer and a third isolation layer in the isolation regions, wherein the third isolation layer is in contact with the first dielectric layer;
the first isolation layer and the third isolation layer are made of a same material, and the first isolation layer and the second isolation layer are made of different materials.

3. The manufacturing method of the semiconductor structure according to claim 2, wherein the sequentially stacking a first isolation layer, a second isolation layer and a third isolation layer in the isolation regions comprises:
forming a first isolation layer in the isolation regions, wherein the first isolation layer covers sidewalls of the isolation portions;
forming a second isolation layer on the substrate exposed in the isolation regions a sidewall of the first isolation layer, and the top surfaces of the isolation portions; and
forming a third isolation layer on the second isolation layer.

4. The manufacturing method of the semiconductor structure according to claim 1, wherein depths of the recesses are 1-3 times a thickness of the third isolation layer in contact with the first dielectric layer.

5. The manufacturing method of the semiconductor structure according to claim 4, wherein the forming a conductive layer on the substrate located in the first opening regions, wherein a height of the conductive layer is lower than heights of the first isolation sidewall structures comprises:
forming a first conductive layer on the substrate located in the first opening regions, wherein a height of the first conductive layer is lower than the heights of the first isolation sidewall structures;
forming a second conductive layer and a third conductive layer on the first conductive layer; and
etching back the second conductive layer and the third conductive layer such that a height of the third conductive layer is lower than the heights of the first isolation sidewall structures, wherein the first conductive layer, the second conductive layer and the third conductive layer form the conductive layer.

6. The manufacturing method of the semiconductor structure according to claim 5, wherein the removing part of the conductive layer located in the first opening region to form two spaced bit line structures comprises:
forming a second dielectric layer on sidewalls and top surfaces of the first isolation sidewall structures located on an upper part of the conductive layer and on a top surface of the conductive layer; and
using the second dielectric layer as a mask to etch part of the conductive layer located in the first opening regions, so as to form two spaced bit line structures.

7. The manufacturing method of the semiconductor structure according to claim 6, wherein a thickness of the second dielectric layer is equal to widths of the formed bit line structures.

8. The manufacturing method of the semiconductor structure according to claim 7, wherein after the removing part of the conductive layer located in the first opening region to form two spaced bit line structures, the method further comprises:
forming a second isolation sidewall structure on a sidewall of each of the bit line structures facing the other bit line structure, wherein the second isolation sidewall structure extends in a direction perpendicular to the substrate.

9. The manufacturing method of the semiconductor structure according to claim 8, wherein the second isolation sidewall structure comprises a fourth isolation layer, a fifth isolation layer and a sixth isolation layer sequentially formed on the sidewall of the bit line structure;
the fourth isolation layer and the sixth isolation layer are made of a same material, and the fourth isolation layer and the fifth isolation layer are made of different materials.

10. The manufacturing method of the semiconductor structure according to claim 9, wherein after the forming a second isolation sidewall structure on a sidewall of each of the bit line structures facing the other bit line structure, the method further comprises:
filling the first opening regions with a third dielectric layer, wherein the third dielectric layer extends outside the first opening regions and covers top surfaces of the first isolation sidewall structures, the second isolation sidewall structures and the bit line structures.

11. The manufacturing method of the semiconductor structure according to claim 10, wherein after the filling the first opening regions with a third dielectric layer, the method further comprises:
    planarizing a surface of the third dielectric layer.

* * * * *